(12) United States Patent
Hofmann et al.

(10) Patent No.: US 6,566,182 B2
(45) Date of Patent: May 20, 2003

(54) DRAM MEMORY CELL FOR DRAM MEMORY DEVICE AND METHOD FOR MANUFACTURING IT

(75) Inventors: Franz Hofmann, Munich (DE); Till Schlosser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/875,803

(22) Filed: Jun. 6, 2001

(65) Prior Publication Data
US 2002/0017668 A1 Feb. 14, 2002

(30) Foreign Application Priority Data
Jun. 6, 2000 (DE) .......................................... 100 28 424

(51) Int. Cl.⁷ .......................................... H01L 21/8238
(52) U.S. Cl. ...................... 438/212; 438/241; 438/268; 438/270
(58) Field of Search ................................ 438/241–244, 438/212, 259, 270, 268; 257/301, 302, 329, 330, 332

(56) References Cited

U.S. PATENT DOCUMENTS

| | | | |
|---|---|---|---|
| 5,008,214 A | 4/1991 | Redwine | 438/243 |
| 5,156,992 A | 10/1992 | Teng et al. | 438/246 |
| 5,198,383 A | 3/1993 | Teng et al. | 438/246 |
| 5,334,548 A | 8/1994 | Shen et al. | 438/246 |
| 5,612,559 A * | 3/1997 | Park et al. | 257/302 |

\* cited by examiner

Primary Examiner—George Fourson
Assistant Examiner—Hsien Ming Lee
(74) Attorney, Agent, or Firm—Fish & Richardson P.C.

(57) ABSTRACT

A DRAM memory cell includes a MOSFET selection transistor having a drain region and a source region in a semiconductor substrate column. A current channel, which is capable of being actuated by a control gate electrode extends in a vertical direction between the drain and source regions. A capacitor is stacked under the selection transistor and electrically connected to the source region in the semiconductor substrate column. Above the selection transistor is a metal bit line electrically connected to the drain region in the semiconductor substrate column. A metal word line in direct electrical communication with the control gate electrode of the selection transistor extends perpendicularly with respect to the metal bit line.

1 Claim, 4 Drawing Sheets

DRAM MEMORY CELL FOR DRAM MEMORY DEVICE AND METHOD FOR MANUFACTURING IT

FIELD OF THE INVENTION

The invention relates to a DRAM memory cell for a DRAM memory device and a method for manufacturing it, the DRAM memory cell having a high reading and storage speed.

BACKGROUND OF THE INVENTION

A DRAM memory is a dynamic semiconductor memory which, as a memory cell in the memory matrix, contains a memory capacitance which can be connected to a bit line via a selection transistor. If a word line WL is placed at a high voltage level, the selection transistor opens and the memory capacitance is connected to the bit line BL. In this state, the memory cell can be written to by virtue of the fact that the capacitance is discharged or charged in accordance with the desired memory contents. FIG. 1 shows the structure of a typical DRAM memory cell according to the prior art.

In order to achieve a higher degree of integration of memory cells on a semiconductor substrate, structures with vertically arranged selection transistors are increasingly being proposed.

U.S. Pat. No. 5,612,559 describes a semiconductor device with a multiplicity of memory cells. Each memory cell has here a column-shaped, vertically arranged selection transistor which contains a drain region and a source region in a semiconductor substrate column, a current channel which also extends in the vertical direction and is controlled by a control gate electrode which completely surrounds the semiconductor column separated by an oxide layer, extending between the drain and source regions. The control gate electrode which is embodied here is formed by etching back a conductive layer which is composed of doped polysilicon, for example. The control gate electrodes of various memory cells are electrically connected to one another and form the word line for actuating the selection transistor.

The memory cell which is described in U.S. Pat. No. 5,612,599 has the disadvantage that the reading and storage speed of a DRAM memory which is made up of such memory cells is very low. The word line formed from the deposited polysilicon in the memory device described in U.S. Pat. No. 5,612,599 has a high electrical resistance owing to the properties of polysilicon as a material. Furthermore, the cross section of the word line formed from polysilicon is very small in the vicinity of the surrounded semiconductor substrate columns. The small cross section of the word line also results in an increase in the electrical resistance of the word line. Because at least 500 memory cells are connected to one another by means of a word line in a typical DRAM memory, the serial connection of the memory cells by means of the high-impedance word line results overall in a very high resistance. The high resistance of the word line results in high RC transit times and thus to low reading and storage speeds in a DRAM memory of such a design.

A further disadvantage of the structure described in U.S. Pat. No. 5,612,599 consists in the fact that the selection transistor is connected to the bit line by means of contact holes. The manufacture of such contact holes is relatively complex in the manufacturing method and, when the structures are of small size, frequently leads to incorrect contacts which may cause memory cells to fail or even the entire DRAM memory to fail.

SUMMARY OF THE INVENTION

The object of the present invention is therefore to provide a DRAM memory cell for a DRAM memory device and a method for manufacturing it which provides a high degree of integration with a simultaneously simple manufacturing process and which ensures a high reading and storage speed of the DRAM memory device.

This object is achieved according to the invention by means of a DRAM memory cell having the features specified in patent claim 1.

The invention provides a DRAM memory cell for a DRAM memory having

- a MOSFET selection transistor which has a drain region and a source region in a semiconductor substrate column, a current channel which runs in the vertical direction between the drain and source regions and which can be actuated by a control gate electrode being provided,
- a capacitor which is stacked under the MOSFET selection transistor and is electrically connected to the source region in the semiconductor substrate column,
- a metal bit line BL which is located above the MOSFET selection transistor and is electrically connected to the drain region in the semiconductor substrate column,
- a metal word line WL being provided which directly electrically contacts the control gate electrode of the MOSFET selection transistor and extends perpendicularly with respect to the metal bit line which makes electrical contact in a direct and self-aligning fashion with the drain region.

In a preferred embodiment, the metal word line has a cross section which corresponds to the minimum lithographic structure size F.

The control gate electrode is preferably composed of deposited polysilicon.

In a further preferred embodiment, the control gate electrode extends essentially parallel to the current channel located in the semiconductor substrate column.

Between the control gate electrode and the current channel there is preferably a dielectric layer with a thickness of 4 to 7 nm.

The metal bit line is preferably composed of a patterned multilayer arrangement which has a titanium nitride layer, a tungsten layer and a polysilicon layer.

The capacitor is preferably electrically connected to a corresponding electrode.

The metal bit line and the corresponding electrode preferably make contact with the DRAM memory cell here from two opposite sides.

In one preferred embodiment of the DRAM memory cell according to the invention, the capacitor is electrically connected to the source region by means of vertically extending polysilicon columns.

The polysilicon columns are preferably electrically insulated from the metal word line by a vertically extending first insulating layer.

In a further preferred embodiment, the metal word line is electrically insulated from the corresponding electrode by a second insulating layer.

The bit line of the control gate electrode is preferably electrically insulated by means of a third insulating layer.

In a particularly preferred embodiment of the DRAM memory cell according to the invention, the insulating layers are composed of silicon nitride.

In a further, particularly preferred embodiment, the capacitor has a dielectric layer made of tantalum pentoxide.

The invention also provides a method for manufacturing DRAM memory cells for a DRAM memory device having the following steps:

semiconductor substrate columns are formed on a main carrier oxide layer which is located above a main carrier semiconductor substrate layer, doping ions are implanted in order to generate a drain region and a source region in the semiconductor substrate columns, thermal oxidation of the semiconductor substrate columns in order to generate a dielectric gate oxide layer, a polysilicon layer, a metal layer and an insulating layer are deposited on the oxidized semiconductor substrate column, anisotropic, chemical, selective dry etching of the deposited layers in order to generate control gate electrodes and metal word lines, polysilicon columns are formed in order to make electrical contact with the source regions in the semiconductor substrate columns, a dielectric capacitor layer is deposited on the polysilicon columns formed, a corresponding electrode is applied to the dielectric capacitor layer, an auxiliary carrier substrate is provided on the corresponding electrode side, the main carrier substrate layer and the main carrier oxide layer are removed, a patterned metal bit line is formed in order to make direct electrical contact, in the semiconductor substrate columns, with the drain regions formed.

BRIEF DESCRIPTION OF THE DRAWINGS

Furthermore, preferred embodiments of the DRAM memory cell according to the invention and methods for manufacturing it are described with reference to the appended figures, in which.

DETAILED DESCRIPTION OF THE DRAWINGS

Furthermore, the individual process steps for manufacturing the DRAM memory cell according to the invention will be described with reference to FIGS. 2, 3.

Figure 1:
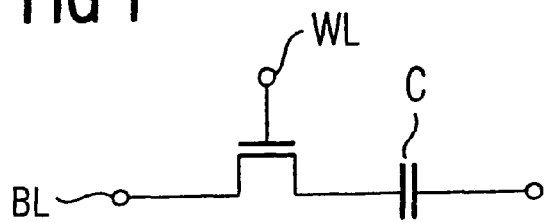
FIG. 1 shows a circuit diagram of a DRAM memory cell according to the invention.
Figure 2A:
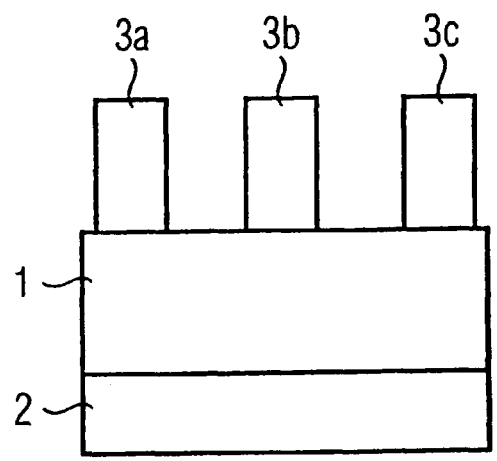
FIGS. 2a–2e show sectional views representing various process steps when the DRAM memory cell according to the invention is manufactured.

Firstly, a multiplicity of semiconductor substrate columns is applied to an SOI wafer, as is apparent in FIG. 2a. The SOI wafer has a main carrier oxide layer 1 and a main carrier substrate layer 2. The main carrier oxide layer 1 is composed, for example, of silicon dioxide and has a thickness of between 0.5 and 2 μm. The main carrier substrate layer 2 of the SOI wafer is composed of bulk silicon and has, for example, a thickness of approximately 0.4 mm. Above the main carrier oxide layer 1 there is a semiconductor substrate layer 3 which is firstly p-type doped. The semiconductor substrate layer 3 is then masked and etched to form semiconductor substrate strips which extend in the direction of the bit lines 20 which will be formed later. The etched trenches formed during the etching process are then filled with an insulating material 4a, for example silicon dioxide. After further masking, an anisotropic dry etching operation is carried out in which equally spaced openings are etched into the exposed, horizontally extending semiconductor substrate strips and are themselves filled with silicon dioxide 4b. In this way, equally spaced semiconductor substrate columns 3a, 3b, 3c are produced, said semiconductor columns 3a, 3b, 3c being separated from one another by means of the filled-in insulating material 4b.

Figure 3A:
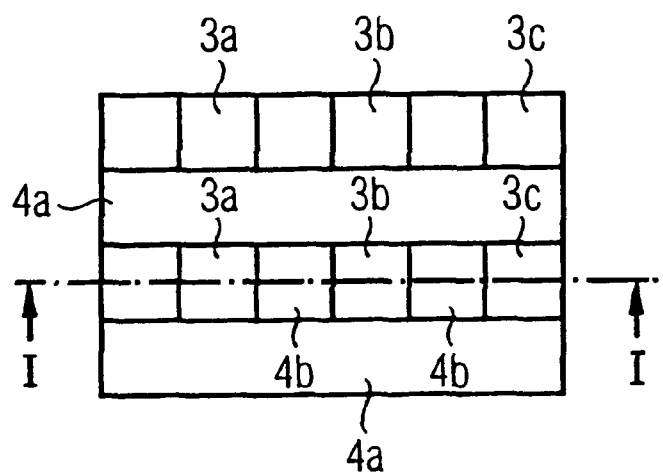
FIGS. 3a–3d show plan views of DRAM memory cells manufactured according to the invention, with various process steps of the manufacturing method according to the invention.
Figure 3B:
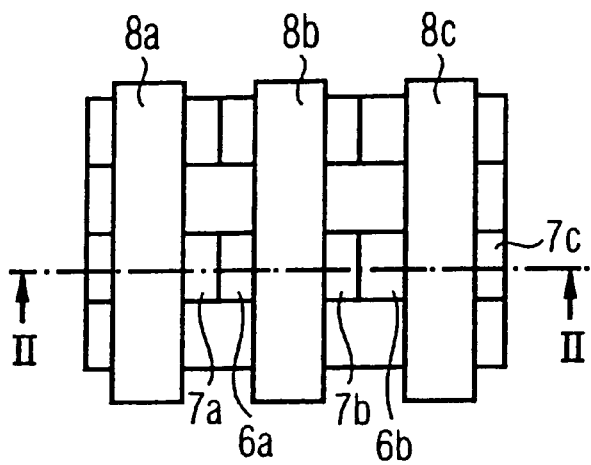
Figure 3C:
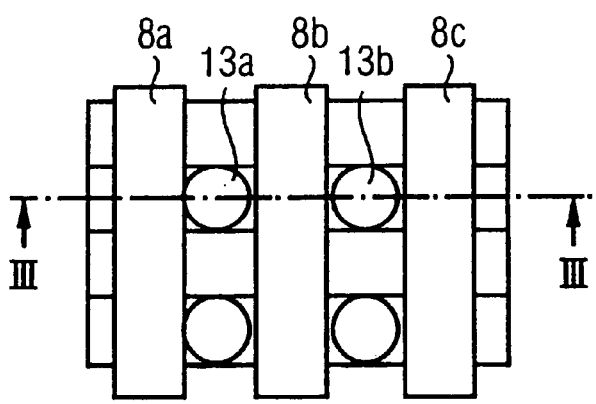

FIG. 2a shows the structure in accordance with the abovementioned process steps, FIG. 2a being a sectional view along the line I—I in the plan view of the memory cell given in FIG. 3a.

Figure 2B:
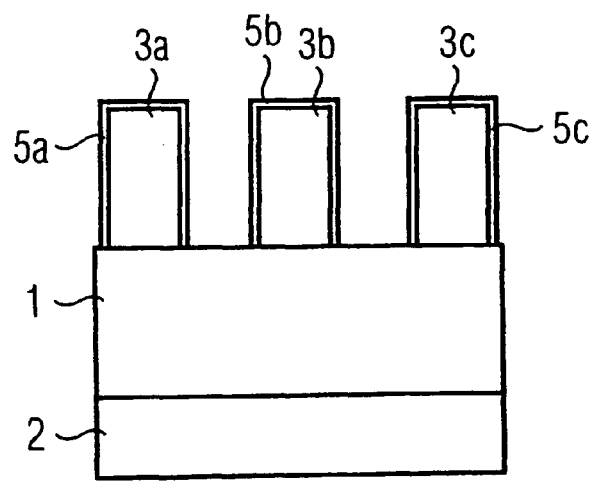

After the semiconductor substrate columns 3a, 3b, 3c are formed, they are thermally oxidized at 800–1000° C. in order to form a patterned sacrificial oxide layer (SAC-OX: Sacrificial Oxide) 5a, 5b, 5c. FIG. 2b shows the resulting structure.

In a further process step, a silicon nitride layer is formed in a CVD process, and chemical-mechanical planarization CMP is carried out. In order to form a drain region, ions are subsequently implanted into the upper region of the semiconductor substrate columns 3a, 3b, 3c. Arsenic ions, for example, may be used for the n+-type implantation. The deposited silicon nitride remaining between the semiconductor substrate columns 3a, 3b, 3c after the chemical-mechanical planarization step CMP is etched back in a subsequent step until relatively thin silicon nitride layers 6a, 6b remain on the trench floors. The sacrificial oxide layer 5a, 5b, 5c is etched away with hydrofluoric acid and the semiconductor substrate columns 3a, 3b, 3c which are exposed as a result are thermally oxidized in order to generate a patterned dielectric gate oxide layer 7a, 7b, 7c. The patterned gate oxide layer 7a, 7b, 7c preferably has a thickness of 4–7 nm. The entire structure is subsequently coated with a polysilicon layer onto which a metal layer is applied. A silicon nitride layer is in turn deposited on the applied metal layer. The metal layer is composed, for example, of tungsten or of tungsten silicide.

Figure 2C:
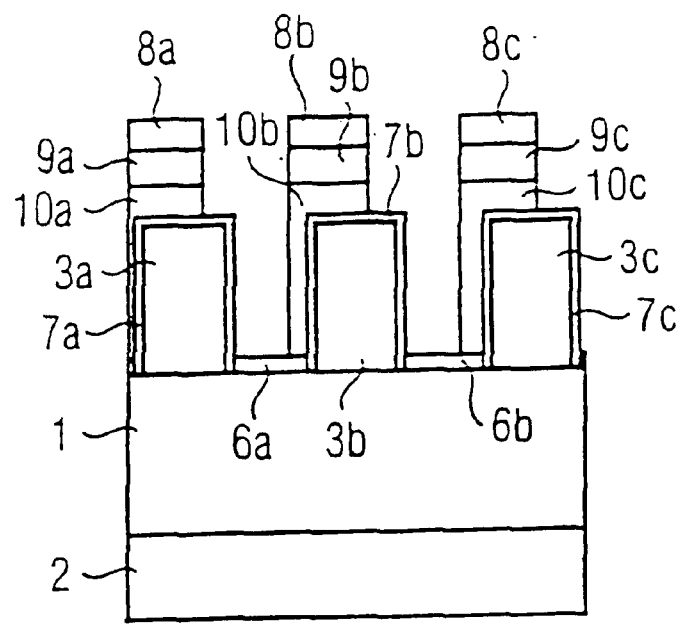

After strip-shaped masking, the applied layers are etched anisotropically in a chemically selective fashion in an etching procedure until the structure illustrated in FIG. 2c is obtained. In FIG. 2c is it possible to see strips lying one below the other, namely silicon nitride strips 8a, 8b, 8c, metal strips 9a, 9b, 9c and polysilicon strips 10a, 10b, 10c lying below them. FIG. 2c shows a sectional view along the line II—II in the memory cell shown in FIG. 3b. In the structure illustrated in FIG. 2c, the selection MOSFET of the DRAM cell which will be finished later has already been completely formed.

Silicon nitride for forming spacers is deposited on the structure illustrated in FIG. 2c in a CVD process and subsequently exposed in an anisotropic dry etching process. This results in the silicon nitride spacers 11 which extend vertically in FIG. 2d and have the purpose of electrically insulating the conductive strips 8, 9, 10 from one another. The remaining openings are filled by an oxide 12 and the entire structure is subsequently planarized.

Figure 2D:
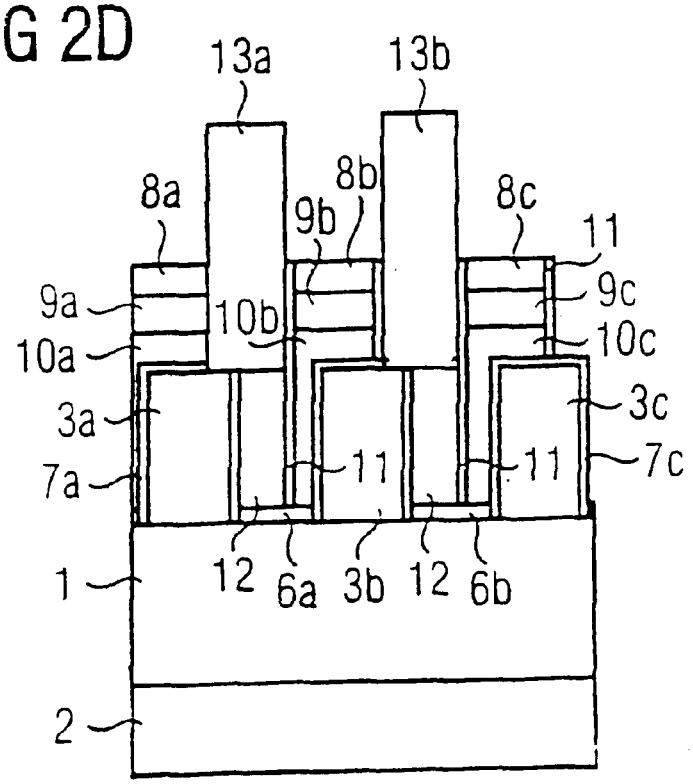

In a further process step, the contact holes for the later capacitors are formed by anisotropic etching back and these contact holes are filled with polysilicon. After chemical-mechanical planarization CMP and a further etching back step of a filler oxide, the polysilicon columns 13a, 13b illustrated in FIG. 2d are produced. The polysilicon columns 13a, 13b are electrically connected here to the semiconductor substrate columns 3a, 3b. FIG. 2d shows a sectional view along the line III—III in the plan view of the memory cells shown in FIG. 3c.

The polysilicon columns 13a, 13b are coated with a dielectric layer 14a, 14b which is composed, for example, of tantalum pentoxide or silicon nitride. In a further step, a polysilicon layer is deposited on the patterned dielectric layer 14a, 14b. The deposited polysilicon layer is patterned in the cell field in order to form a corresponding electrode for the capacitor. The patterned corresponding electrode is filled with a filler oxide in a further step, after which a chemical-mechanical planarization CMP is carried out. In a wafer bonding step, an auxiliary carrier substrate 17 is applied or bonded onto the planarized filler oxide 16. This is carried out by heating the opposing faces and subsequently joining them. After the joining operation, the boundary surface is cooled and a predetermined period of waiting takes place until an irreversible chemical bond has been produced between the planarized oxide 16 and the auxiliary carrier substrate 17.

The processing of the structure which is produced is carried out for the further process steps from the opposite side. For this purpose, the entire structure is "turned around" and the main carrier substrate layer 2 which is now located at the top is etched away by wet etching. In addition, the main carrier oxide layer 1 is removed by chemical-mechanical planarization CMP or by means of a further etching step. Ions for forming drain regions of the selection MOSFET are implanted into the now exposed surfaces of the semiconductor substrate columns 3a, 3b, 3c. The entire structure is subsequently coated with polysilicon 18. Preferably a titanium nitride layer 19 is applied over the latter and is itself covered with a metal layer 20 of tungsten. The titanium nitride intermediate layer 19 serves to provide better adhesion of the metal layer 20 on the polysilicon 18. The applied layers 18, 19, are patterned in a further process step to form bit lines BL.

Figure 2E:
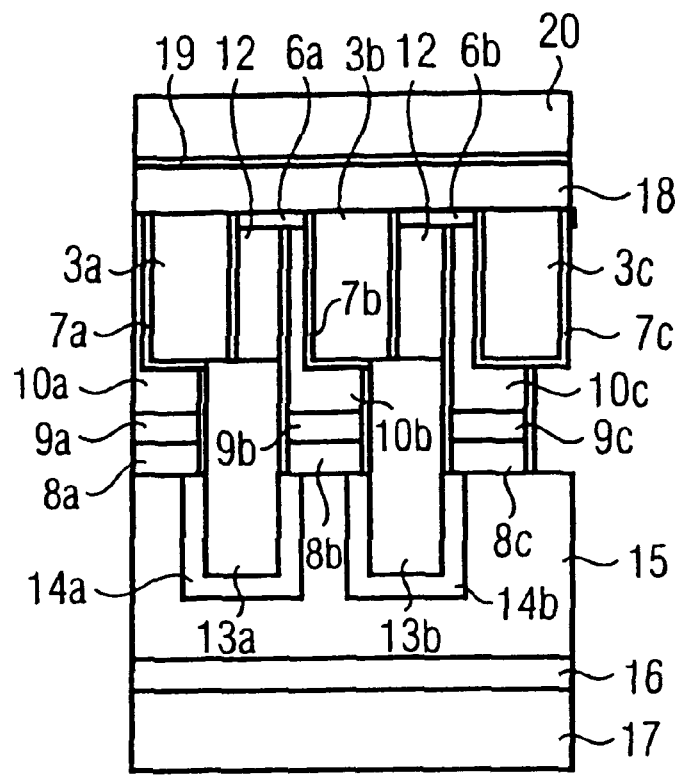
Figure 3D:
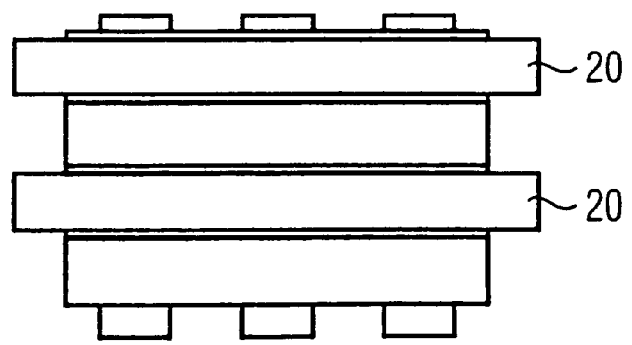

FIG. 2e shows the finished DRAM structure after the manufacturing method according to the invention has been carried out. FIG. 3d shows a plan view after the manufacturing steps have been carried out in order to form the DRAM structure according to the invention.

The semiconductor substrate columns 3a, 3b, 3c each have a vertically extending current channel which, separated by the gate oxide 7a, 7b, 7c, can be actuated electrically by control gate electrodes 10a, 10b, 10c. In the view shown in FIG. 2e, the drain region in the semiconductor substrate columns 3a, 3b, 3c is respectively located at the top and is electrically connected directly to the patterned polysilicon layer 18. The source region of the MOSFET selection transistor is located in each case at the bottom within the semiconductor substrate columns 3a, 3b, 3c in the illustration shown in FIG. 2e, and is electrically connected directly to the polysilicon columns 13a, 13b. The stacked capacitors which are laid under the MOSFET selection transistors are formed by the corresponding electrode 15 and the polysilicon strips 13a, 13b which are separated therefrom by a dielectric layer 14a, 14b.

As is apparent from FIG. 2e, the control gate electrode regions 10a, 10b, 10c of the MOSFET selection transistor are electrically connected directly to the word line strips 9a, 9b, 9c. The metal word lines 9a, 9b, 9c are preferably composed here of tungsten or of tungsten silicide. The metal word lines therefore have a very low electrical resistance for actuating the control gate electrodes 10a, 10b, 10c. The cross section of the metal word lines 9a, 9b, 9c corresponds here approximately to the minimum lithographic structure size F of the manufacturing process and is thus comparatively large. This large cross section additionally decreases the resistive conductivity of the metal word lines 9a, 9b, 9c. The control gate electrodes 10a, 10b, 10c extend in the vertical direction parallel to the respective current-conducting channel of the MOSFET located in the semiconductor substrate column 3a, 3b, 3c.

The word lines 9a, 9b, 9c illustrated in the sectional view in FIG. 2e and the patterned bit lines 20 extend perpendicularly to one another. As is also clear from FIG. 2e, the bit lines 20 are electrically connected to the drain regions of the semiconductor substrate columns 3a, 3b, 3c in a direct and self-aligning fashion without contact holes having to be fabricated for this purpose. The connection of the drain regions to the bit lines 20 can therefore be manufactured very easily in terms of technical processes.

The DRAM memory cell according to the invention which is illustrated in FIG. 2e provides a very high degree of integration owing to the vertically arranged selection MOSFETs and the capacitors stacked under them. A memory cell has approximately the size of 4 F2, the smallest defined lithographic size being F (0.2 µm. The manufacturing process for manufacturing the DRAM memory cell according to the invention is very simple and has, in particular, a very simple metallization process. Owing to the fact that direct contact is made with the control electrode terminals 10a, 10b, 10c of the selection MOSFETs by means of metal word lines 9a, 9b, 9c, the control electrodes of the selection MOSFETs can be actuated by means of a very low electrical resistance. As a result, the RC transit time is very short and the reading and writing speeds for reading and writing to the DRAM memory cell according to the invention are consequently very high.

What is claimed is:

1. A method for manufacturing DRAM memory cells, the method comprising:

forming semiconductor substrate columns on a main carrier oxide layer located above a main carrier semiconductor substrate layer;

generating source regions in the semiconductor substrate columns by implanting doping ions therein;

generating dielectric gate oxide layers by thermal oxidation of the semiconductor substrate columns;

depositing, on the oxidized semiconductor substrate columns, a polysilicon layer, a metal layer and an insulating layer;

generating control gate electrodes and metal word lines by anisotropic, chemical, and selective dry etching of the polysilicon layer, the metal layer and the insulating layer;

forming polysilicon columns to make electrical contact with the source regions in the semiconductor substrate columns;

depositing a dielectric capacitor layer on the polysilicon columns;

applying a corresponding electrode to the dielectric capacitor layer;

providing an auxiliary carrier substrate on the corresponding electrode side;

removing the main carrier substrate layer and the main carrier oxide layer;

generating drain regions by implanting doping ions into the semiconductor substrate columns; and forming a patterned metal bit line to make direct electrical contact, in the semiconductor substrate columns, with the drain regions.

* * * * *